United States Patent [19]

Dickerson

[11] 4,241,305

[45] Dec. 23, 1980

[54] METHOD AND APPARATUS FOR LOCATING FAULTS IN ELECTRIC CABLES

[75] Inventor: Arthur F. Dickerson, Woodland Hills, Calif.

[73] Assignee: Hughes Aircraft Company, Culver City, Calif.

[21] Appl. No.: 953,289

[22] Filed: Oct. 20, 1978

[51] Int. Cl.³ .......................................... G01R 31/08
[52] U.S. Cl. ................................................... 324/52
[58] Field of Search .................. 324/181, 186, 187, 52

[56] References Cited

U.S. PATENT DOCUMENTS

| | | | |
|---|---|---|---|
| 2,794,071 | 5/1957 | Hughes et al. | 324/52 |
| 3,462,681 | 8/1969 | Biskup | 324/52 |
| 3,470,331 | 9/1969 | Barash et al. | 324/52 |
| 3,670,240 | 6/1972 | Maranchak . | |
| 4,013,948 | 3/1977 | Tanaka | 324/52 |

FOREIGN PATENT DOCUMENTS 723977 of 0000 United Kingdom .
765993 of 0000 United Kingdom .

Primary Examiner—Michael J. Tokar
Attorney, Agent, or Firm—Allen A. Dicke, Jr.; W. H. MacAllister

[57] ABSTRACT

The faulted cable is connected in a loop with a spark gap at one end. Voltage is applied until the spark gap breaks down and the arrival time of the resultant forward wave is measured at both ends of the loop to measure total cable length. Next, the spark gap is opened and the voltage is built up until the fault breaks down. The time of receipt of the wavefront at the two ends of the loop is measured to determine the location of the fault. The apparatus comprises the power supply equipment, the spark gap and the time measuring equipment with its voltage divider and clamp.

20 Claims, 5 Drawing Figures

METHOD AND APPARATUS FOR LOCATING FAULTS IN ELECTRIC CABLES

BACKGROUND OF THE INVENTION

This invention is directed to a method and apparatus for locating faults in electric cables, in particular the high impedance or nonlinear impedance faults in enclosed cables, such as buried or pipe cables.

Locating a cable fault is often a time-consuming and laborious process, the ultimate cost of which is highly dependent on the accuracy that can be achieved in the initial measurement of the distance from the cable terminals to the fault. The measurement errors inherent in the presently available equipment make necessary some type of tracing technique to determine the exact location of the fault. Any improvement in the accuracy of the measurement of the fault distance from the terminal will reduce the cost by reducing the time consumed in finding the exact location with tracing techniques. This is particularly important since the number, voltage rating, and length of electric cables installed by U.S. utilities is rapidly increasing.

Furthermore, the efficiency of existing measurement equipment is dependent on the nature of the fault, particularly its impedance. For faults with impedance of 50 ohms of less, existing equipment is considered satisfactory. High-impedance faults, which often occur after an initial breakdown of the cable insulation, require that some impedance reduction technique be used. As the power ratings of cables increase, the size and cost of the equipment required to perform this also increases. A more accurate, convenient method of fault location is clearly needed. This method should utilize a single instrument capable of supporting both terminal and tracing techniques through a simple procedure adaptable to all types of faults.

The accuracy of available fault location equipment is limited by several factors associated with both the cable and the measurement instrument itself. These uncertainties reduce the accuracy with which the distance from the fault to the cable terminals can be measured and makes tracing techniques necessary. Tracing is often a time consuming and laborious process, so that improved fault location equipment has the potential for substantially reducing the cost of locating faults in electric cables.

SUMMARY OF THE INVENTION

In order to aid in the understanding of this invention, it can be stated in essentially summary form that it is directed to a method and apparatus for locating faults in electric cables. The method comprises forming a loop circuit including the faulted cable and sending a wavefront from an arc around the loop to determine the time for the wavefront to pass around the loop, then causing the fault to arc and measuring the time of arrival of the wavefront at the ends of the loop and using this time measurement to determine the distance to the fault from one end of the loop. The apparatus comprises a power supply for causing the arcs, an arc device to generate the first arc and time measuring equipment for measuring the time of arrival of the wavefronts.

Accordingly, it is an object of this invention to provide a method for locating faults in electric cables, and particularly buried electric cables where the fault may not be a linear fault. It is another object to provide a method whereby the location of a fault in a cable can be determined with reasonable accuracy by causing forward moving wavefront traverse of the loop including the fault and measuring the time for wavefront traverse at the ends of the loop. It is another object to provide an apparatus for locating faults in electric cables which apparatus is economic and easy to use so that it can be conveniently employed by persons in the field without requiring extensive training or technical experience.

Other objects and advantages of this invention will become apparent from the study of the following portion of the specification, the claims and the attached drawings.

DETAILED DESCRIPTION OF THE DRAWINGS

DESCRIPTION OF THE PREFERRED EMBODIMENTS

Figure 1:
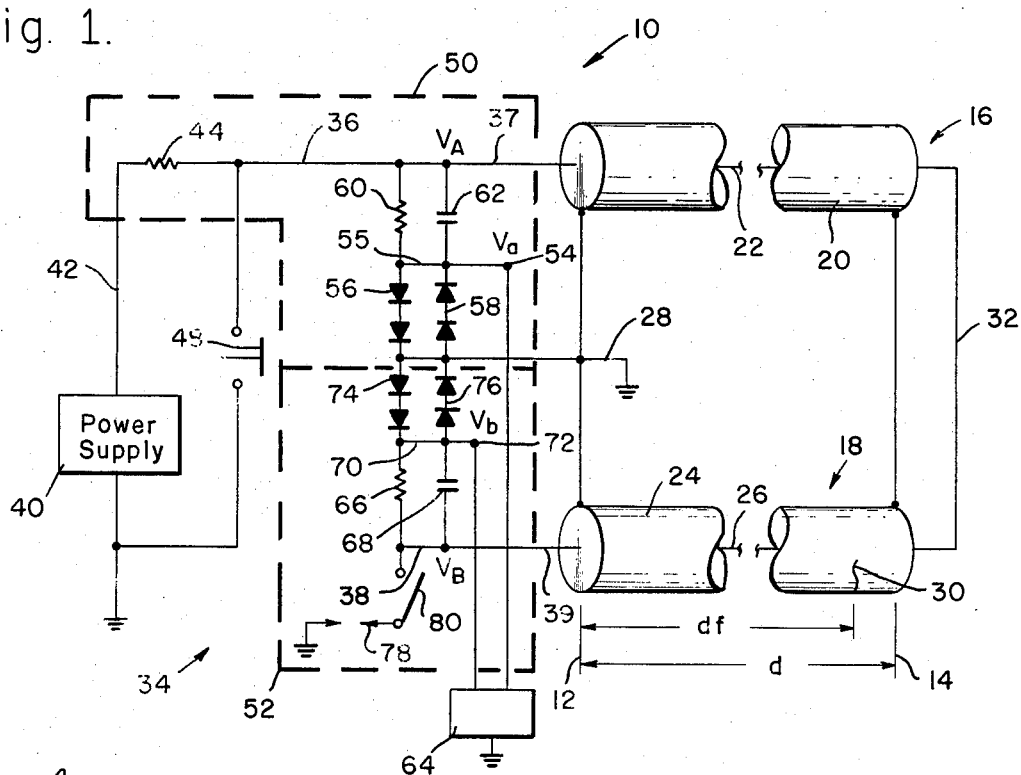
FIG. 1 is a schematic electrical diagram of the apparatus for locating faults in electric cables in accordance with this invention and showing it in association with a cable loop.

FIG. 1 shows a cable segment 10 which extends from a point 12 to a point 14 at which the segment is accessible. Cables are often bundled in sets of three with a common neutral or ground return and are buried underground. Lengths of 1 to 5 kilometers are common segment lengths. A cable 16 and a cable 18 are illustrated. The cable 16 comprises a cover 20 and a conductor 22 therein. The cable 18 comprises a cover 24 with a conductor 26 therein. The covers 20 and 24 are illustrated as being grounded together and to a common ground 28 of the system. The conductors are sometimes individually insulated and located in a single pipe which serves as a cover for the cables. The conductors usually have oil-filled paper dielectric or other insulation which may heal after the initial breakdown. An example of a fault is indicated at 30. The points 12 and 14 are points in which the cable segment may be exposed, for example in manholes or at a substation. The length of the cable segment between the connection points is d and the distance to the fault is df, as indicated in FIG. 1.

After a fault occurs, the cable is taken out of service and is approached at both the points 12 and 14. At the point 14, the conductor 26 of the faulted cable is connected to the conductor 22 of the unfaulted cable by means of a connection 32 to produce the cable loop. At the point 12, the fault locating apparatus 34 is connected to the cables 16 and 18. The conductor 22 is connected to a bus 36 at the terminal 37 while the conductor 26 is connected to a bus 38 at a terminal 39.

A power supply 40 is connected between the ground 28 and by a line 42 through a resistor 44 to the bus 36. A normally closed switch 48 is parallel to short the output. When the normally closed switch 48 is opened, charging of the cable begins.

Figure 2:
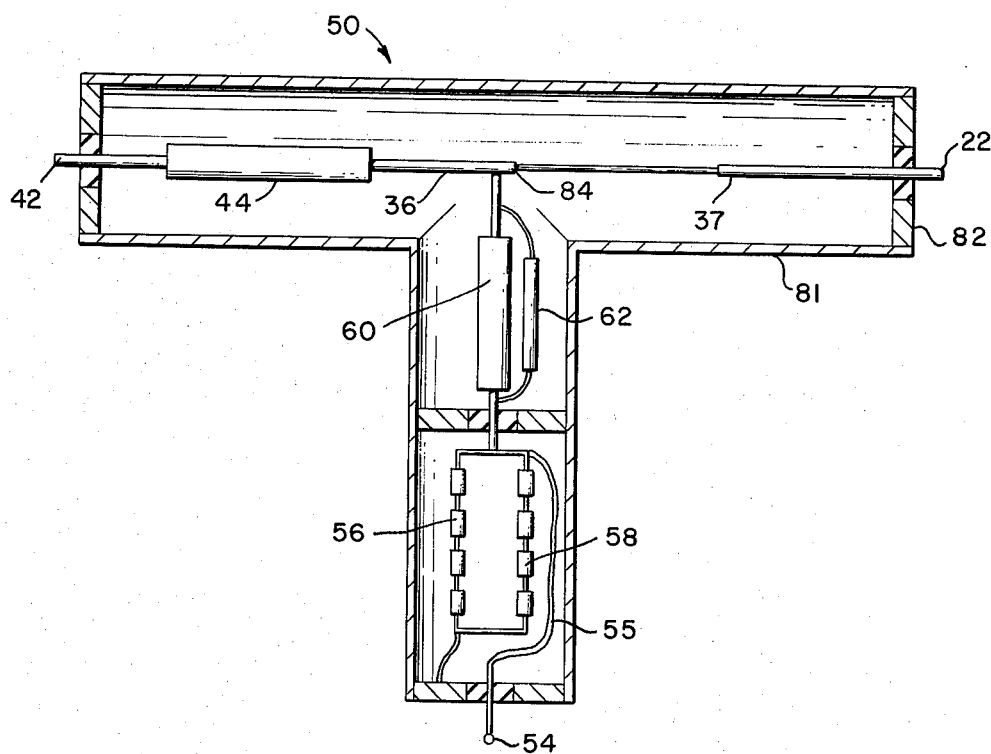
FIG. 2 is a sectional view through the unit of the apparatus shown at the top center of the schematic diagram of FIG. 1.
Figure 3:
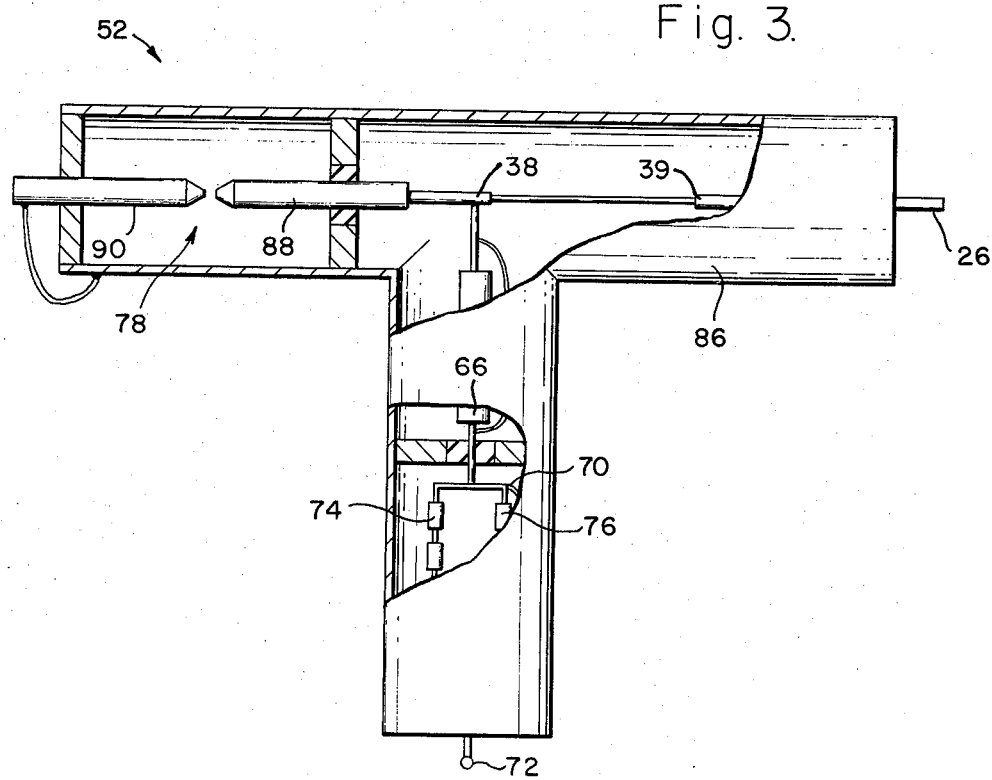
FIG. 3 is a partial section through the unit of the apparatus shown at the bottom center of FIG. 1.

The fault locating apparatus 34 also includes a unit 50 and a unit 52 illustrated schematically in FIG. 1 and illustrated mechanically in FIGS. 2 and 3. The unit 50 has its bus 36 supplied from the resistor 44 and supplies current to the conductor 22. In order to sample the voltage transitions in the bus 36, a voltage divider is provided in the unit 50. The unit 50 has a test point 54 at which the signal is read. The signal represents the step function in the voltage experienced upon receipt of a forward wavefront. The test point 54 is connected to the voltage divider by a line 55. A diode string 56 connects the line 55 to ground and an oppositely facing diode string 58 also connects the line 55 to the ground 28. Thus, excursion of the voltage at the test point 54 and the line 55 above and below ground level are limited to the forward breakdown voltage of the diode strings. Where there are four diodes in each string and the breakdown voltage is 0.7 volt per diode, then the maximum voltage excursion at the test point 54 will be plus or minus 2.8 volts, or a total of 5.6 volts. This is a reasonable voltage for supplying to timing equipment. A resistor 60 and a capacitor 62 communicate the voltage of $V_A$ in the bus 36 to the test point 54 through the line 55. A timer 64 is connected to the test point 54 for time measurement of signals.

The unit 52 is similar to the unit 50. The line 26 is connected to the bus 38 at the terminal 39. The bus 38 is connected through a resistor 66 and a capacitor 68 which serve as one leg of a voltage divider which is connected by a line 70 and a test point 72. Sets of oppositely oriented diode strings 74 and 76 connect the line 70 to the ground 28 to clamp the test point 72 with the respective ground at the forward breakdown voltage of the diode strings, as described with respect to the diode strings 56 and 58. The timer 64 is connected also to a test point 72. The structure of the resistor 66, capacitor 68 and the diode strings 74 and 76 is the same as the counterparts in unit 50 so that the structural details thereof are not shown in FIG. 3.

A spark gap 78 has one electrode connected to the end of the bus, 38, with its other electrode grounded. A switch 80 may be used in connection with the spark gap 78, or the spark gap 78 can be opened to a sufficient gap so that it effectively acts as an open switch when the gap function is not desired.

The apparatus 10 measures the time of arrival of wavefronts at the test points 54 and 72, and thus the connections to the timer 64 must be as short as possible. Furthermore, the spark gap 78 is part of the fault locating apparatus 34 and is also positioned closely to the terminal connection 39 of the conductor 26 with the bus 38. In order to minimize radiant noise, the units 50 and 52 are formed as coaxial structures. A shield body 81, see FIG. 2, is in the form of a T-shaped metallic tubing with the conductor 22 inserted in one end through an insulator disc 82. The conductor 22 is connected at terminal 37 to the bus 36 such as by a connector plug in connector 84 all within the grounded shield 80. Also, within the grounded shield 81 are the resistors 44 and 60, the capacitor 62 and the diode strings 56 and 58. Thus, all are substantially shielded to inhibit external electromagnetic radiation.

The unit 52 is similar, and has a shield 86 which encloses the same connections and voltage divider to the test point 72 as the comparable structure in unit 50. Spark gap 78 is composed of a fixed electrode 88 and a movable electrode 90, which is movable both to known gaps for known breakdown voltages and is movable sufficiently wide to present an open circuit. The movable electrode 90 is grounded to the shield 86, which is in turn grounded to the rest of the system including the main ground 28.

In the method for locating faults in electric cables and with respect to the use of the fault locator apparatus 34, the first step is to isolate at both ends, the cable segment to be measured and then connect them together at the far end by connection 32. The far end of the unfaulted cable 16 is thus connected to the far end of the faulted cable 18. The near ends of both the cables are connected to the fault locating apparatus 34 as indicated in FIGS. 1, 2 and 3. The spark gap 78 is set so that it breaks down at a voltage lower than the breakdown voltage of the fault 30, for example, about 5 to 10 kilovolts in a transmission line cable. Normally closed switch 48 is opened and power supply 40 slowly raises the dc voltage in the cable loop formed of the conductors 22 and 26 of the two cables in the cable segment, and the connected circuitry in the fault locating apparatus 34. The voltage builds up until the spark gap 78 breaks down and arcs.

Figure 4:
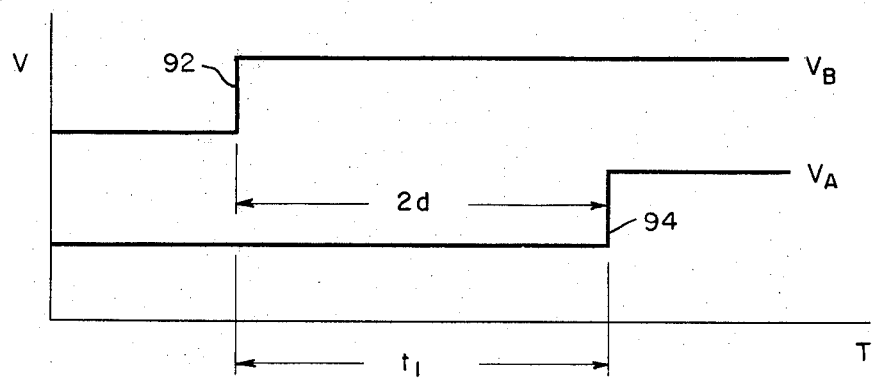
FIG. 4 is a timing diagram showing the time the forward moving wavefront takes to traverse the loop, with an external arc supplying the wavefront transient.

When this occurs, a steep wavefront is sent around the cable loop from the near end where it is first detected at the test point 72. This is a step rise 92 seen in FIG. 4. The wavefront passes around the cable loop and is then detected at the test point 54 as a step rise 94. In FIG. 4, the step rises 92 and 94 can either be voltages in the buses in the test unit or with the smaller scaling factor provided by the voltage divider and diode clamps, may be step rises at the test points. While the step function at the spark gap 78 is steep and contains many high-frequency components, the corresponding step function received at the bus 36 is less steep owing to the loss of high-frequency components in the cable. However, the signal voltage at the test point 54 and 72 is clamped to the first five volts of the wave to produce a reproducible signal and a very large signal to noise ratio results. The time between these step rises is measured and is t1. When t1 is multiplied with the propagation velocity, then the propagation path $2d$, which is twice the cable segment length, is determined. The actual segment length should be known to the operator from records made at the time of installation of the cable segment. Thus, the operator can check the apparatus to establish that it is operating correctly and all connections are properly made.

Figure 5:
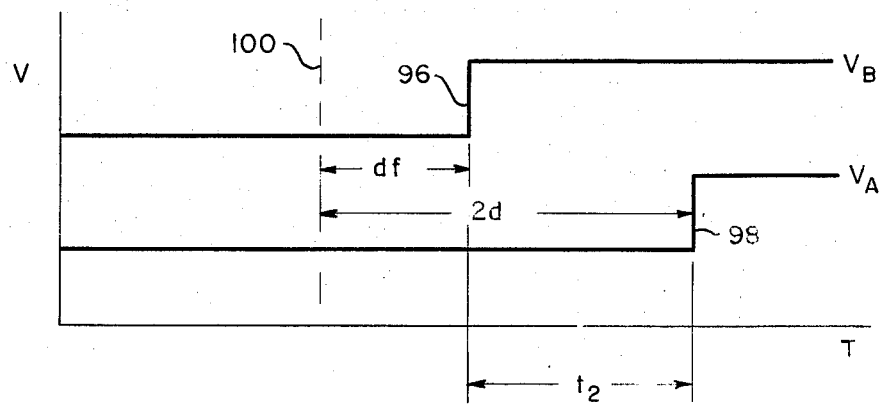
FIG. 5 is a timing diagram showing the timing measurements received at the ends of the cable loop when the cable arcs at its internal fault.

Next, the spark gap 78 is opened so that the bus 38 is not effectively connected therethrough. The power supply 40 slowly builds up the voltage on the conductors in both cables. However, this time it is the nonlinear fault 30 that breaks down, generating a steep wavefront. One part of this wave travels inbound to terminal 39 and appears as a step rise signal 96, see FIG. 5, at the test point 72. The other part of the wave travels around the loop through the connection 32 and the conductor 22 of the unfaulted cable 16 and appears at the test point 54 as the step rise 98. The timing apparatus 64 measures the difference between the arrival times of the two waves. Both waves make one way trips with no reflections. Furthermore, they traverse the same cable as the wavefront represented in FIG. 4 and thus have the same propagation velocity. The timer 64 measures the time between the two wavefronts as t2. It is to be noted that when the fault 30 breaks down the wavefront proceeds in both directions from the fault. It proceeds the distance df to an arbitrary line 100 (see FIG. 5) and at the same time proceeds the same distance around the loop in the other direction. Thus:

$$t2 = 2d/v - 2df/v \qquad (1)$$

$$t2 = 2(d-df)/v \qquad (2)$$

As previously discussed:

$$t1 = 2d/v \qquad (3)$$

The ratio of interest is the fractional distance of the fault along the cable segment:

$$FD = df/d \qquad (4)$$

Since the wavefront propagation velocities cancel out, then:

$$FD = 1 - t2/t1 \qquad (5)$$

It is a simple matter for properly designed logic to calculate and display the fractional distance to the fault. Since the cable segment length is known, then the actual distance to the fault can also be calculated in the apparatus, if desired. With the timer 64 configured to measure both t1 and t2 then it is a simple matter for the timer to calculate the fractional distance FD.

This invention having been described in its preferred embodiment, it is clear that it is susceptable to numerous modifications and embodiments within the ability of those skilled in the art and without the exercise of the inventive faculty. Accordingly, the scope of this invention is defined by the scope of the following claims.

What is claimed is:

1. An apparatus for locating a fault in a subsurface electrical cable having a conductor having first and second terminals, said apparatus comprising:
   means for providing a loop in the cable so that said first and second terminals are adjacent each other and the cable is electrically continuous between said first and second terminals;
   a spark gap for connection to said second terminal;
   power supply means for connection to said first terminal; and
   time measuring means positioned at said adjacent first and second terminals and connected to both said first and second terminals for measuring the time interval between forward moving wavefronts arriving at said adjacent first and second terminals so that as said power supply means charges up said conductor and said spark gap breaks down to send a forward wave through the conductor, the time of arrival of said forward wave is detected and measured at said adjacent second and first terminals and when the power supply charges the conductor so that the fault breaks down to generate a forward wave in both directions through the conductor, said time measuring means measures the time interval between arrival of the forward wave at said adjacent first and second terminals so that the position of the fault along the first and second terminals so that the fractional position of the fault along the conductor can be calculated without knowing propagation velocity.

2. The apparatus for locating a fault in an electric cable in accordance with claim 1 wherein a voltage divider is connected to each of said adjacent first and second terminals and said time measuring means is connected to said voltage dividers so that a lesser voltage than the entire arc generated wavefront is applied to said time measuring means.

3. The apparatus for locating a fault in an electric cable in accordance with claim 2 wherein said voltage dividers include a clamping circuit to limit voltage excursions applied to said time measuring means.

4. The apparatus for locating a fault in an electric cable in accordance with claim 3 wherein said clamping circuit comprises two oppositely oriented diodes connected in parallel so that the voltage excursions applied to said time measuring means are limited to the forward breakdown voltage of said diodes.

5. An apparatus for locating a fault in a subsurface electrical cable having a conductor having first and second terminals, said apparatus comprising:
   means for providing a loop in the cable so that said first and second terminals are adjacent each other and the cable is electrically continuous between said first and second terminals;
   a spark gap for connection to said second terminal;
   power supply means for connection to said first terminal;
   a voltage divider connected to each of said adjacent first and second terminals, said voltage divider having a clamping circuit to limit voltage excursions said voltage divider having, a gound connection and said voltage divider comprising a serial connection between a resistor and a diode connected between said first terminal and said ground connection and also comprising a serial connection of a second resistor and a second diode connected between said second terminal and said ground connection; and
   time measuring means positioned at said adjacent first and second terminals, said time measuring means being connected into said voltage divider at the junction between said first resistor and said first diode and the junction between said second resistor and said second diode for measuring the time interval between forward moving wavefronts arriving at said adjacent first and second terminals so that as said power supply means charges up said conductor and said spark gap breaks down to send the forward wave through said conductor, the time of arrival of said forward wave is detected and measured at said adjacent second and first terminals and when the power supply charges the conductor so that the fault breaks down to generate a forward wave in both directions through the conductors said time measuring means measures the time interval between the arrival of the forward wave at said adjacent first and second terminals so that the fractional position of the fault along the conductor can be calculated without knowing propagation velocity.

6. The apparatus for locating a fault in an electric cable in accordance with claim 5 wherein said first and second resistors in said voltage divider are each a resistor assembly comprised of a resistor connected in parallel to a capacitor.

7. The apparatus for locating a fault in an electric cable in accordance with claim 5 wherein first and second diodes are each connected in its own series diode string to form oppositely oriented diode strings each of a plurality of diodes to clamp the voltage applied to said time measuring means to excursions above and below ground in accordance with the forward breakdown voltage of said diode strings.

8. An apparatus for locating a fault in a subsurface electrical cable having a conductor having first and second terminals, said apparatus comprising:

means for providing a loop in the cable so that said first and second terminals are adjacent each other and the conductor is electrically continuous between said first and second terminals;

a spark gap for connection to said second terminal;

power supply means for connection to said first terminal;

time measuring means positioned at said adjacent first and second terminals and connected to both said adjacent first and second terminals for measuring the time interval between forward moving wavefronts arriving at said adjacent first and second terminals so that as said power supply means charges up the conductor and said spark gap breaks down to send a forward wave through the conductor, the time of arrival of said forward wave is detected and measured at said adjacent first and second terminals and when the the power supply charges the conductor so that the fault breaks down to generate a forward wave in both directions through the conductor, said time measuring means measures the time interval between arrival of the forward wave at said adjacent first and second terminals so that the fractional position of the fault along the conductor can be calculated without knowing propagation velocity; and a shielding housing positioned between said spark gap and said time measuring means to protect said time measuring means from direct electromagnetic radiation from arcing at said spark gap.

9. The apparatus for locating a fault in electric power cables in accordance with claim 2 wherein said voltage divider has a high voltage section and a low voltage section and there is a shielding housing surrounding and separating both said high voltage section and said low voltage section.

10. Apparatus for locating a fault in an electric cable comprising:

means for connecting to the conductor in an electric cable having a fault therein at a first terminal at a first end of the conductor;

a charging resistor connected to said connection means and for connection to charging means for charging the conductor with respect to ground;

a voltage divider having a high voltage section and a low voltage section, said voltage divider having its high voltage end connected to said first terminal; and a metallic shielding housing encompassing said voltage divider and said charging resistor to inhibit electromagnetic radiation into the environment exterior to said shielding housing.

11. The apparatus of claim 10 wherein an interior wall divides the shielding housing and the low voltage section of said voltage divider is positioned on the opposite side of said dividing wall from said first terminal.

12. Apparatus for locating a fault in an electric cable having a conductor and a second terminal to which the conductor can be connected, said apparatus comprising:

a spark gap having a first electrode connected to said second terminal and a second electrode connected to ground, said apparatus further comprising a voltage divider having a high voltage section and a low voltage section, with said high voltage section being connected to said second terminal; and a shielding housing embracing said second terminal, said spark gap electrodes and said voltage divider to inhibit electromagnetic radiation to the environment exterior of said shielding housing.

13. The apparatus for locating a fault in an electric cable of claim 12 wherein an interior wall divides said housing and said high voltage section of said voltage divider is positioned on the same side of said wall as said second terminal and said spark gap and on the opposite side of said wall from said low voltage section to protect said low voltage section from electromagnetic radiation.

14. The apparatus for locating a fault in an electric cable of claim 12 further comprising:

means for connecting to said conductor at a first terminal a charging resistor for connection to charging means for charging the conductor so that the conductor can be charged with respect to ground;

a second voltage divider having a high voltage section and a low voltage section, said voltage divider having its high voltage end connected to said first terminal; and a metallic shielding housing encompassing said second voltage divider and said charging resistor to inhibit electromagnetic radiation into the environment exterior to said shielding housing.

15. The apparatus of claim 14 wherein an interior wall in each said shielding housing divides each shielding housing and the low voltage section of each said voltage divider is positioned on the opposite side of its dividing wall from said terminal.

16. A circuit for locating a fault in a subsurface electric cable having first and second conductor terminal points comprising:

means for connecting the cable into an electrically continuous loop so that said first and second terminals are closely adjacent each other;

means for connecting to the first conductor terminal point;

means for connecting to the second conductor terminal point;

means for connecting a power supply to one of said terminal point connection means to charge the conductor so that the conductor will breakdown to ground to send a forward moving voltage wavefront both ways along the conductor to said adjacent first and second conductor connection means;

spark gap means for connection to one of said terminal point connection means so that when said spark gap has a lower breakdown voltage than the conductor fault, arcing of said spark gap sends a forward moving voltage wave from said spark gap means through said conductor from said one connection means to the other said closely adjacent connection means; and time measuring means connected to both said first and second adjacent connection means to measure the time of forward moving wavefront arrival at said first and second connection means.

17. The circuit of claim 16 further including a voltage divider connected to said first and second connection means and said time measuring means to reduce the voltage applied to said time measuring means.

18. The circuit of claim 17 wherein said voltage divider includes a clamping circuit to limit voltage applied to said time measuring means.

19. The method for locating a fault in a faulted subsurface electric cable having a conductor loop which has first and second terminals closely adjacent each other comprising the steps of:
- charging the conductor until a spark gap attached to one of the terminals breaks down to send a forward moving voltage wavefront along the conductor between the first and second adjacent terminals;
- measuring the elapsed time interval of the forward moving voltage wavefront at the first and second adjacent terminals;
- charging the conductor until the fault therein breaks down to produce a forward moving voltage wavefront from the fault location to each of the first and second adjacent terminals; and
- measuring the time interval between arrival of the wavefronts at the first and second adjacent terminals so that the fractional distance location of the fault can be deduced from the two measured time intervals.

20. The method for locating a fault in an electric cable in accordance with claim 16 wherein the time for wavefront transit produced by the spark gap arc is considered t1 and the difference in time of arrival of the waves at the two terminals as a result of the fault breakdown is t2 so that the fractional distance of the fault down the conductor is $(1 - t2/t1)/2$.